US011570940B2

(12) United States Patent
Sugimoto et al.

(10) Patent No.: US 11,570,940 B2
(45) Date of Patent: Jan. 31, 2023

(54) COMPONENT MOUNTING APPARATUS WITH FEEDER CONTROL DEVICE

(71) Applicant: FUJI CORPORATION, Chiryu (JP)

(72) Inventors: Koichiro Sugimoto, Anjo (JP); Akira Takahashi, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 269 days.

(21) Appl. No.: 15/552,363

(22) PCT Filed: Mar. 2, 2015

(86) PCT No.: PCT/JP2015/056062
§ 371 (c)(1),
(2) Date: Aug. 21, 2017

(87) PCT Pub. No.: WO2016/139713
PCT Pub. Date: Sep. 9, 2016

(65) Prior Publication Data
US 2018/0027709 A1 Jan. 25, 2018

(51) Int. Cl.
*H05K 13/08* (2006.01)
*H05K 13/04* (2006.01)
*H05K 13/00* (2006.01)

(52) U.S. Cl.
CPC ..... *H05K 13/0857* (2018.08); *H05K 13/0084* (2013.01); *H05K 13/0408* (2013.01);
(Continued)

(58) Field of Classification Search
CPC .......... H05K 13/0408; H05K 13/0417; H05K 13/0419; H05K 13/08; H05K 13/083;
(Continued)

(56) References Cited

U.S. PATENT DOCUMENTS 6,047,874 A 4/2000 Asai et al.
7,220,095 B2 5/2007 Lyndaker et al.
(Continued)

FOREIGN PATENT DOCUMENTS

JP 11-26985 A 1/1999
JP 2005-539370 A 12/2005
(Continued)

OTHER PUBLICATIONS

Kaplan et al, IEEE Spectrum, Industrial Electronics: Computer-Based Manufacturing Systems, Expert Systems, and Process Controllers continue to draw attention, as does Robotry for the Assembly of Surface-Mounted Components, pp. 61-64, Jan. 1986. (Year: 2022).*

(Continued)

*Primary Examiner* — A. Dexter Tugbang
(74) *Attorney, Agent, or Firm* — Oblon, McClelland, Maier & Neustadt, L.L.P.

(57) ABSTRACT

A component mounting apparatus including a component supply device which includes a carrier tape that accommodates a component to be mounted on a board in which a plurality of feeders having carrier tapes loaded are respectively mounted at a plurality of mounting positions, which automatically discharges a carrier tape to a tape insertion port of the feeder based on a component discharge instruction, and which automatically conveys an inserted carrier tape to a suction position at which a component is suctioned when the carrier tape is inserted into the tape insertion port; and control device which instructs discharge or supply of a component.

8 Claims, 8 Drawing Sheets

(52) U.S. Cl.
CPC ......... *H05K 13/0419* (2018.08); *H05K 13/08* (2013.01); *H05K 13/083* (2018.08); *H05K 13/086* (2018.08); *H05K 13/0882* (2018.08); *H05K 13/0417* (2013.01); *H05K 13/084* (2018.08); *Y10T 29/4913* (2015.01); *Y10T 29/49133* (2015.01); *Y10T 29/53174* (2015.01); *Y10T 29/53178* (2015.01)

(58) Field of Classification Search
CPC ............... H05K 13/084; H05K 13/086; H05K 13/0882; H05K 13/0084; H05K 13/0857; Y10T 29/53174; Y10T 29/53178; Y10T 29/4913; Y10T 29/49133
See application file for complete search history.

(56) References Cited

U.S. PATENT DOCUMENTS

| | | | |
|---|---|---|---|
| 7,850,040 B2 | 12/2010 | Davis et al. | |
| 8,266,787 B2 | 9/2012 | Oyama et al. | |
| 2002/0184747 A1* | 12/2002 | Kuribayashi | H05K 13/086 29/428 |
| 2008/0217459 A1* | 9/2008 | Wada | H05K 13/0419 242/389 |
| 2010/0242267 A1* | 9/2010 | Tsukagoshi | H05K 13/0419 29/739 |
| 2010/0313407 A1* | 12/2010 | Ohno | H05K 13/0419 29/464 |
| 2011/0072654 A1* | 3/2011 | Oyama | H05K 13/0419 29/832 |
| 2013/0326867 A1* | 12/2013 | Uesugi | H05K 13/0419 29/705 |
| 2015/0039115 A1 | 2/2015 | Sagara et al. | |

FOREIGN PATENT DOCUMENTS

| | | | |
|---|---|---|---|
| JP | 2010-507908 A | | 3/2010 |
| JP | 2011061158 A | * | 3/2011 |
| JP | 2011-77096 A | | 4/2011 |
| JP | 2014-11315 A | | 1/2014 |
| JP | 2015-28970 A | | 2/2015 |
| WO | WO 2014/068712 A1 | | 5/2014 |

OTHER PUBLICATIONS

International Search Report dated May 19, 2015 in PCT/JP2015/056062 filed Mar. 2, 2015.

* cited by examiner

FIG. 7

| JOB N | JOB N+1 | JOB N+2 |
|---|---|---|
| A | A | A |
| B | B | D |
| C | F | F |
| D | G | I |
| E | H | |

PD (pointing to JOB N+1 column)

COMPONENT MOUNTING APPARATUS WITH FEEDER CONTROL DEVICE

TECHNICAL FIELD

The present application relates to a feeder control device, control method, and a component mounting apparatus which can automatically discharge a carrier tape which accommodates a component type not to be used in production of a next board type therein when board types to be produced are switched.

BACKGROUND ART

In PTL 1 and PTL 2, a feeder which can automatically convey a carrier tape to a suction position at which a component is suctioned without performing splicing processing, is described, splicing work due to component shortage becomes unnecessary by using the feeder, and there is no case where a component mounting apparatus is stopped by the splicing.

CITATION LIST

Patent Literature

PTL 1: JP-T-2010-507908
PTL 2: JP-A-2011-77096

SUMMARY

Technical Problem

In general, a feeder of a component mounting apparatus is mounted to be attachable to and detachable from multiple slots provided in a component supply device, and the feeder on which a carrier tape which accommodates a predetermined component type therein is loaded can be mounted on a predetermined slot when necessary. Therefore, for example, when production of a certain board type is finished and production of the next board type is started, setup changing work of detaching the feeder on which a component type used in the production of the certain board type is loaded from the slot, and mounting the feeder on which a component type to be used in the production of the next board type is loaded onto the slot, is performed. When the setup changing work takes a lot of time, stopping time of the component mounting apparatus becomes longer and an operating ratio of the apparatus deteriorates.

Considering the above-described problem, an object of the disclosure is to provide a feeder control device, control method, and a component mounting apparatus which can automatically discharge an unnecessary carrier tape without detaching the feeder when board types to be produced are switched.

Solution to Problem

In order to solve the above-described problem, there is provided a feeder control device in a component mounting apparatus of the disclosure including a control device which automatically discharges a carrier tape that accommodates a component type to be mounted on aboard type to a tape insertion port based on a component discharge instruction, and automatically conveys an inserted carrier tape to a suction position at which a component is suctioned when the carrier tape is inserted into the tape insertion port, in which the control device includes a component determination section which determines a component type not to be used in production of the next board type when board types to be produced by the component mounting apparatus are switched, and a discharge instruction section which sends an instruction of discharging a carrier tape that accommodates the component type determined not to be used in the production of the next board type by the component determination section to the tape insertion port.

Advantageous Effects

According to the disclosure, since it is possible to automatically discharge a carrier tape which accommodates a component type not to be used in the production of the next board type therein to a tape insertion port, labor and time are not required for discharging the carrier tape from the feeder, and it is possible to suppress occurrence of a human error, such as discharge of a carrier tape from a wrong feeder.

BRIEF DESCRIPTION OF DRAWINGS

FIG. 7 is a view illustrating component data stored in a RAM of the control device.

DESCRIPTION OF EMBODIMENTS

Figure 1:
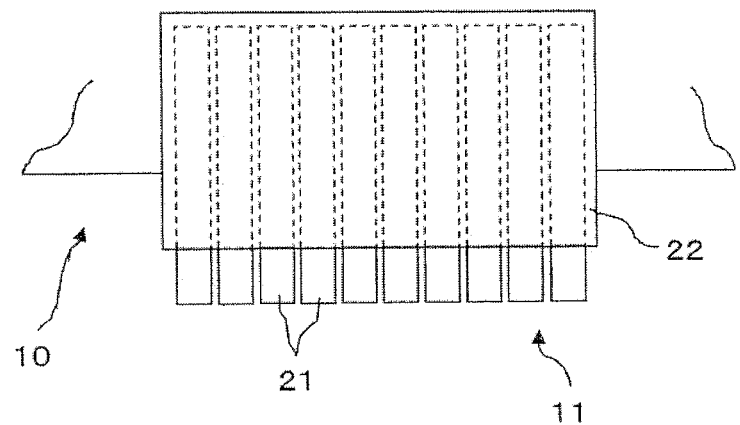
FIG. 1 is a plan view illustrating an outline of a component supply device in an appropriate component mounting apparatus according to an embodiment of the disclosure.

Hereinafter, an embodiment of the disclosure will be described based on the drawings. FIG. 1 illustrates a component mounting apparatus 10 provided with a component supply device 11. The component mounting apparatus 10 includes: a board conveyance device 13 (refer to FIG. 6) which conveys a board that is not illustrated to a component mounting position; and a component mounting device 14 (refer to FIG. 6) which has a suction nozzle that is not illustrated and suctions a component supplied by the component supply device 11, and which mounts the component suctioned by the suction nozzle onto the board.

Figure 2:
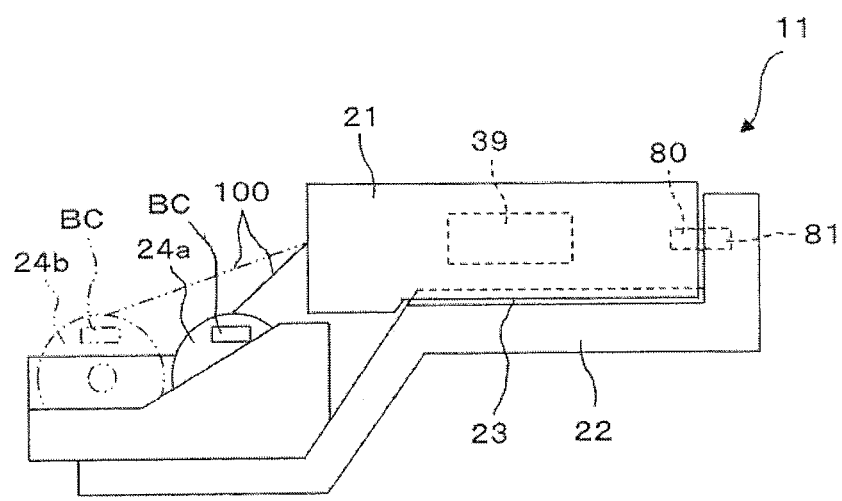
FIG. 2 is a side view illustrating an outline of a feeder mounted on the component supply device.

Multiple feeders 21 are removably mounted on the component supply device 11 by being mounted on slots 23 (refer to FIG. 2) that include multiple slot positions as mounting positions provided on a feeder mounting section 22. When the feeder 21 is mounted on the slot 23, as illustrated in FIG. 2, a connector 80 provided in the feeder 21 is connected to a connector 81 attached to the feeder mounting section 22, electric power is supplied to the feeder 21 side from the main body side of the component mounting apparatus 10 via the connectors 80 and 81, and necessary information can be communicated between the feeder 21 and the component mounting apparatus 10.

Two reels 24a and 24b wound with a carrier tape 100 can be removably attached to the feeder 21. Bar codes BC which indicate information of the component types accommodated in the carrier tapes 100 wound around the reels 24a and 24b are given to the reels 24a and 24b.

As will be described later, the feeder 21 has a configuration in which it is possible to automatically convey a carrier tape 100 inserted into a tape insertion port to a suction position at which a component is suctioned, and to automatically discharge the carrier tape 100 to the tape insertion port.

Figure 3:
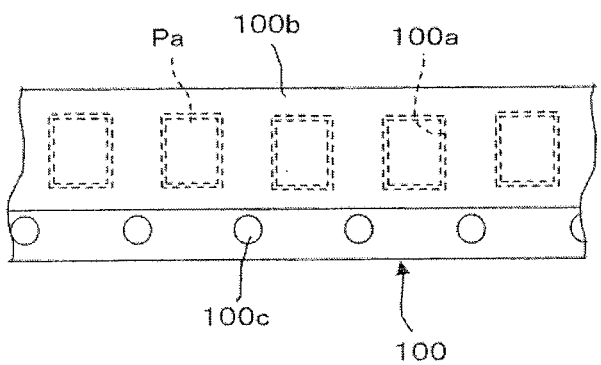
FIG. 3 is a top view of a carrier tape which accommodates components therein.

As illustrated in FIG. 3, the carrier tape 100 is a tape which is formed to have component storage sections 100a that accommodate multiple components Pa, such as electronic components, therein, at a constant interval in a longitudinal direction of the tape. A cover tape 100b which covers the component storage sections 100a is attached to an upper face of the carrier tape 100. In one side section of the carrier tape 100, feeding holes 100c penetrate at a constant interval in a longitudinal direction of the tape, sprockets which will be described later are engaged with the feeding holes 100c, and the carrier tape 100 advances and retreats.

Figure 4:
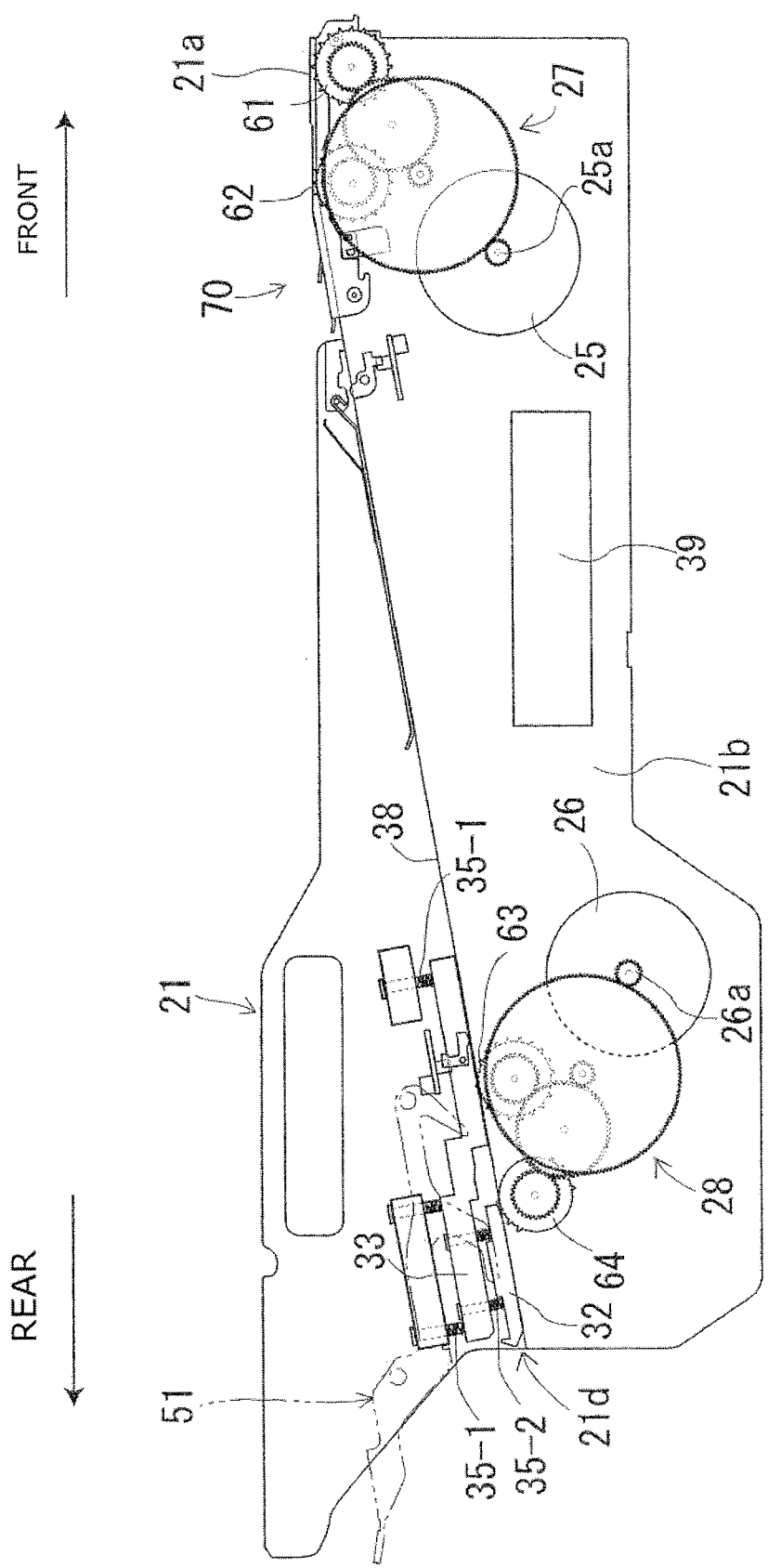
FIG. 4 is a side view of an appropriate feeder according to the embodiment of the disclosure.
Figure 5:
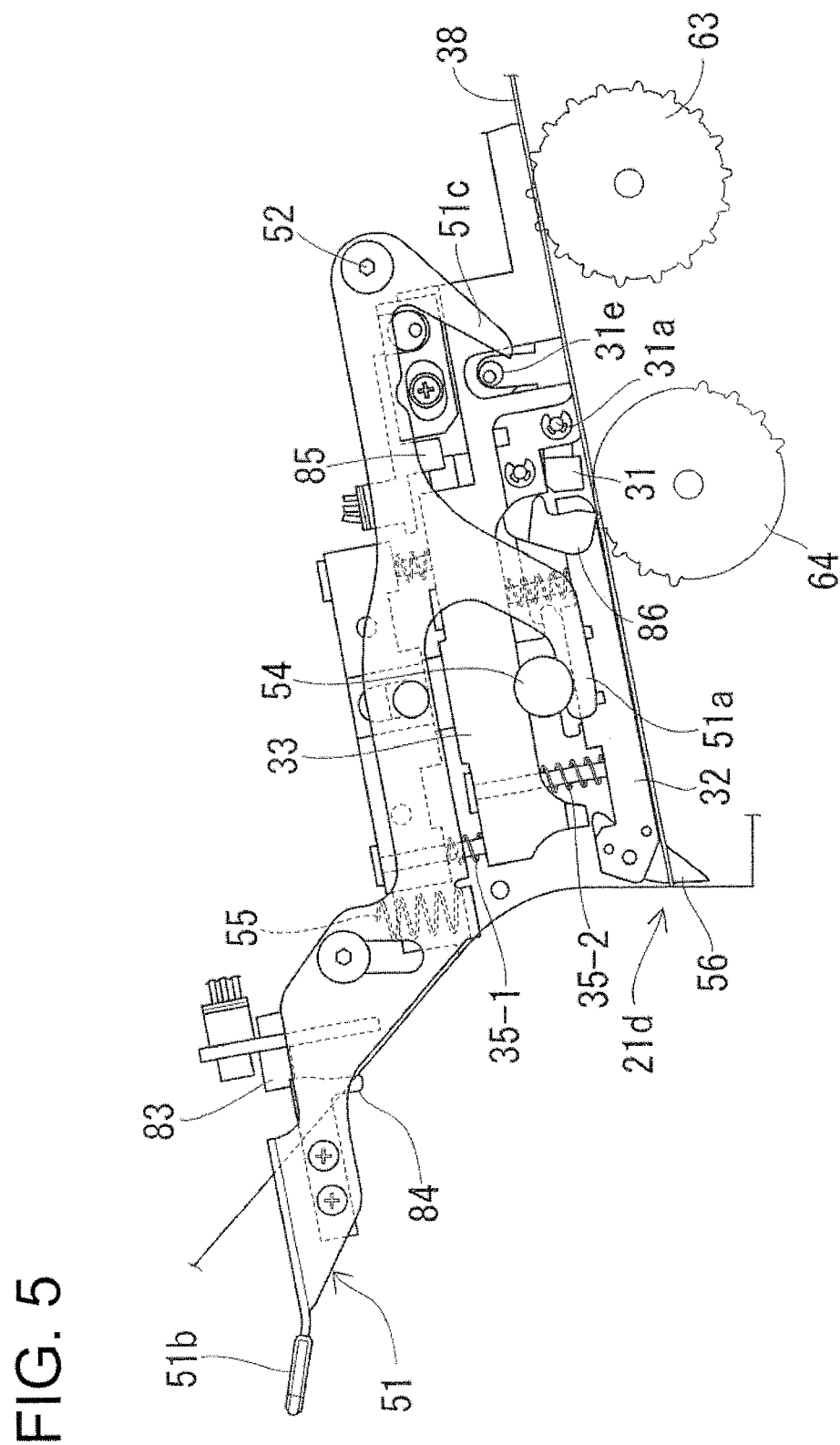
FIG. 5 is a view in which a portion of FIG. 4 is enlarged.

Next, a configuration of the feeder 21 will be described based on FIGS. 4 and 5. The feeder 21 is mainly configured with a feeder main body 21b, a first servomotor 25, a second servomotor 26, a tape insertion recognition lever 51, a first sprocket 61 and a second sprocket 62 which function as front side sprockets, a third sprocket 63 and a fourth sprocket 64 which function as rear side sprockets, a tape conveyance rail 38, a control section 39, and a cover tape peeling device 70. In addition, FIGS. 4 and 5 illustrate an inner structure of the feeder 21 to be visually seen by removing a side wall of the feeder main body 21b.

The tape conveyance rail 38 guides conveyance of the carrier tape 100, and the tape conveyance rail 38 is installed from a tape insertion port 21d provided at a rear part of the feeder main body 21b to a suction position 21a at a front part. Under the front part of the tape conveyance rail 38, the first sprocket 61 and the second sprocket 62 which can be engaged with the feeding holes 100c of the carrier tape 100 are provided to be rotatable. Under the rear part of the tape conveyance rail 38, the third sprocket 63 and the fourth sprocket 64 which can be engaged with the feeding holes 100c of the carrier tape 100 are provided to be rotatable. In addition, in the tape conveyance rail 38, a window hole (not illustrated) is provided such that each of the sprockets 61 to 64 can be engaged with the carrier tape 100 that is conveyed in the tape conveyance rail 38.

The first servomotor 25 is a motor which rotates the first sprocket 61 and the second sprocket 62. A rotating shaft 25a of the first servomotor 25 is linked to the first sprocket 61 and the second sprocket 62 via a gear mechanism 27. The second servomotor 26 is a motor which rotates the third sprocket 63 and the fourth sprocket 64. A rotating shaft 26a of the second servomotor 26 is linked to the third sprocket 63 and the fourth sprocket 64 via a gear mechanism 28. A tape driving device is configured with the first and second servomotors 25 and 26.

An inlet pressing member 32 is provided to be disposed along an upper face of the rear part of the tape conveyance rail 38 being close to the tape insertion port 21d, and to be vertically movable to be capable of being separated from and in contact with the tape conveyance rail 38. The inlet pressing member 32 is pressed downward by a spring 35-2, and usually, comes into contact with an upper face of the tape conveyance rail 38. A downstream side pressing member 33 presses the carrier tape 100 on the downstream side of the inlet pressing member 32, and is provided to be vertically movable to be capable of being separated from and in contact with the tape conveyance rail 38. The downstream side pressing member 33 is pressed downward by a spring 35-1, and usually, comes into contact with the upper face of the tape conveyance rail 38.

At the rear part of the feeder main body 21b, as illustrated in FIG. 5, the front part of the tape insertion recognition lever 51 is supported by a pivot 52, and is swingable. At a center part of the tape insertion recognition lever 51, an operation engaging section 51a which is engaged with a lower face of an engagement member 54 provided in the inlet pressing member 32, is formed. The tape insertion recognition lever 51 is swung in a counterclockwise direction of FIG. 5 by a biasing force of a spring 55, and usually, is held at a position at which the operation engaging section 51a is lowered, and makes the inlet pressing member 32 abut against the tape conveyance rail 38 by a biasing force of the spring 35-2. According to this, usually, the tape insertion port 21d is blocked by a baffle plate 56 which is pivotally supported by the rear part of the inlet pressing member 32, and the carrier tape 100 cannot be inserted into the tape insertion port 21d.

Meanwhile, when an operation knob 51b provided at a rear end of the tape insertion recognition lever 51 is raised up by an operator, and the tape insertion recognition lever 51 is swung against the biasing force of the spring 55, the inlet pressing member 32 is raised against the biasing force of the spring 35-2 by the operation engaging section 51a. Accordingly, the inlet pressing member 32 is separated from an upper part of the tape conveyance rail 38, the tape insertion port 21d is open, and the carrier tape 100 can be inserted.

A recognition sensor 83 which can recognize that the tape insertion recognition lever 51 is swung, that is, that the carrier tape 100 can be inserted, is attached to the feeder main body 21b. The recognition sensor 83 turns ON by a dog 84 attached to the tape insertion recognition lever 51.

A stopper member 31 is provided to be adjacent to the downstream side of the inlet pressing member 32. The stopper member 31 is swingable while a shaft support section 31a provided at the intermediate part thereof is pivotally supported by the downstream side pressing member 33.

At the front part of the tape insertion recognition lever 51, an actuating section 51c which can be engaged with an engaging section 31e provided at the front part of the stopper member 31, is formed, and when the tape insertion recognition lever 51 is swung against the biasing force of the spring 55, the engaging section 31e of the stopper member 31 is engaged with the actuating section 51c. Accordingly, the stopper member 31 is swung in the counterclockwise direction of FIG. 5 around the shaft support section 31a against biasing force of a spring which is not illustrated, and a rear end part of the stopper member 31 abuts against the tape conveyance rail 38. In addition, the rear end part of the stopper member 31 is usually separated from the tape conveyance rail 38 such that the carrier tape 100 can be inserted.

A dog 86 which operates a tape detection sensor 85 is pivotally supported by the downstream side pressing member 33. When the carrier tape 100 does not exist in the tape conveyance rail 38, a tip end of the dog 86 abuts against the upper face of the tape conveyance rail 38 by biasing force of a spring which is not illustrated, but when the carrier tape 100 is inserted into the tape conveyance rail 38, the dog 86 is pushed up by the carrier tape 100 and the tape detection sensor 85 turns ON.

Next, an operation of the feeder 21 will be described. Usually, the tape insertion recognition lever 51 is held in a state illustrated in FIGS. 4 and 5 by the biasing force of the spring 55, and the inlet pressing member 32 abuts against the tape conveyance rail 38 and blocks the tape insertion port 21d by the baffle plate 56.

In this state, when the operation knob 51b of the tape insertion recognition lever 51 is raised up by the operator, the inlet pressing member 32 is separated from the tape conveyance rail 38 via the operation engaging section 51a. Accordingly, the tape insertion port 21d is open, and the carrier tape 100 can be inserted. When the tape insertion recognition lever 51 is raised up, the recognition sensor 83 is operated by the dog 84, and it is recognized that the operation of the tape insertion recognition lever 51, that is, that the carrier tape 100 can be inserted. An operation signal of the recognition sensor 83 is transmitted to a control device 15 via the control section 39 of the feeder 21, and into which feeder 21 among the multiple feeders 21 is recognized the carrier tape 100 can be inserted by the control device.

In this state, by the operator, the carrier tape 100 is inserted onto the tape conveyance rail 38 through the tape insertion port 21d, and the carrier tape 100 is inserted to a predetermined position which abuts against the rear end part of the stopper member 31. Accordingly, since the dog 86 is operated by the carrier tape 100, the tape detection sensor 85 is operated, and the insertion of the carrier tape 100 is detected.

When the insertion of the carrier tape 100 is detected and the tape insertion recognition lever 51 swings and returns to an original position, the first and second servomotors 25 and 26 which configure the tape driving device are driven, and the third and fourth sprockets 63 and 64 are rotated. Accordingly, the fourth sprocket 64 is engaged with a feeding hole 100c of the carrier tape 100, and the carrier tape 100 is conveyed to the third sprocket 63 side by the fourth sprocket 64.

In accordance with the conveyance of the carrier tape 100 by the fourth sprocket 64, the downstream side pressing member 33 is raised up against the biasing force of the spring 35-1 by the carrier tape 100, and the carrier tape 100 is conveyed between the downstream side pressing member 33 and the tape conveyance rail 38. When a feeding hole 100c of the carrier tape 100 conveyed by the fourth sprocket 64 is engaged with the third sprocket 63, the carrier tape 100 is conveyed to the second sprocket 62 side by the third sprocket 63.

When a feeding hole 100c formed in the carrier tape 100 is engaged with the second sprocket 62, the carrier tape 100 is fed to the cover tape peeling device 70 by the second sprocket 62, and the cover tape 100b which is attached to the upper face of the carrier tape 100 is peeled by the cover tape peeling device 70. In addition, when a feeding hole 100c of the carrier tape 100 is engaged with the first sprocket 61, the components accommodated in the carrier tape 100 are sequentially conveyed to the suction position 21a, and are suctioned by the suction nozzle which is not illustrated in the component mounting device 14 at the suction position 21a.

In addition, in a case where the carrier tape 100 is conveyed by the feeder 21, the carrier tape 100 raises up the front end section of the stopper member 31, and accordingly, the stopper member 31 is swung, and the rear end part of the stopper member 31 comes into contact with the upper face of the carrier tape 100.

Therefore, in this state, as described above, when the tape insertion recognition lever 51 is operated to swing (the recognition sensor 83 is ON) and the following carrier tape 100 is inserted between the upper face of the previous carrier tape 100 and the inlet pressing member 32 through the tape insertion port 21d, the tip end of the following carrier tape 100 abuts against the rear end part of the stopper member 31 and stops at this position. Therefore, further conveyance of the following carrier tape 100 is interrupted, and the following carrier tape 100 is on standby at this position.

Figure 6:
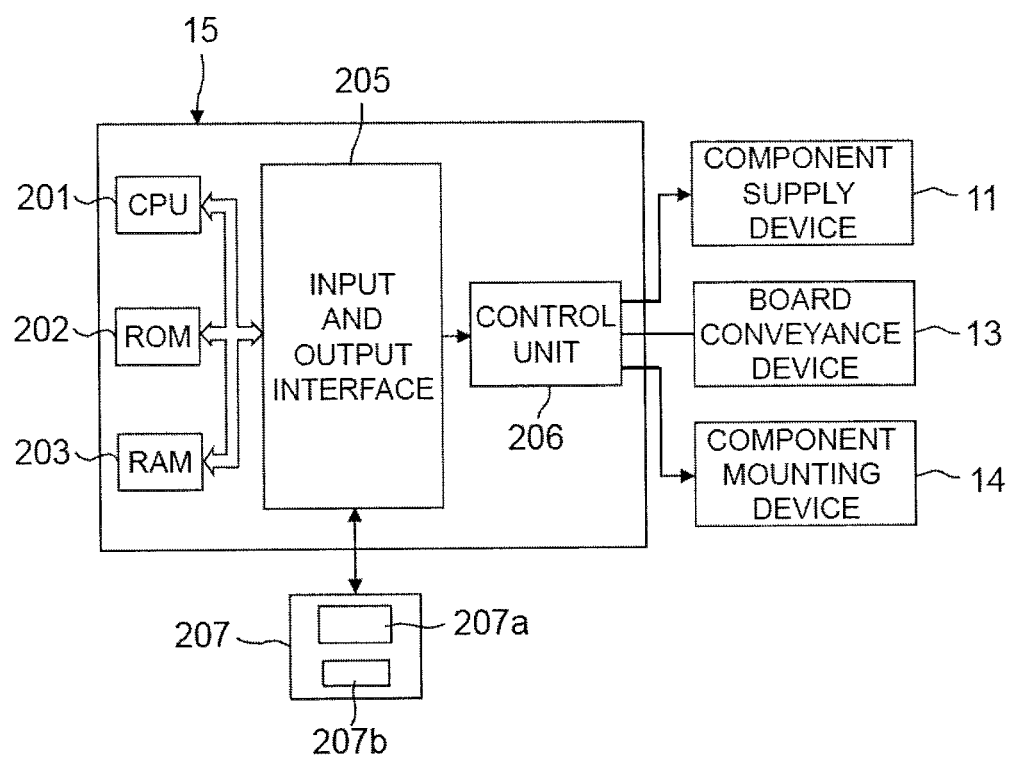
FIG. 6 is a block diagram illustrating a control device which controls the component mounting apparatus.

The component supply device 11, the board conveyance device 13, and the component mounting device 14 in the component mounting apparatus 10 are controlled by the control device 15 which is illustrated in FIG. 6. The control device 15 includes a CPU 201 which functions as a central processing unit, a ROM 202 and a RAM 203 which function as a storage device, and an input and output interface 205. As well as the first and second servomotors 25 and 26 provided in each of the feeders 21 of the component supply device 11, a control unit 206 which controls each of the motors of the board conveyance device 13 and the component mounting device 14, is connected to the input and output interface 205.

In addition, an operation panel 207 which is provided with a display device 207a, such as an LCD, which functions as a display section, and an input device 207b which inputs data by an operation of a keyboard or a mouse, is connected to the input and output interface 205. In the display device 207a, when the setup in accordance with a change in board type is changed, from which feeder 21 of the component supply device 11 a component type (carrier tape 100) is discharged is displayed.

In the ROM 202, as well as a basic program for mounting the components on the board, a sequence program for controlling a sequence operation of the component mounting device 14 or the like, are accommodated. In addition, in the RAM 203, component data related to information of component types to be used in production of the board type, component arrangement data which indicates relationship between the component types and the feeders 21, or data related to a production schedule of board types, are stored.

FIG. 7 illustrates component data PD which is necessary for producing the multiple board types, and thus, in FIG. 7, an example in which production of boards in which component types A, B, C, D, and E are used is performed in the production (hereinafter, referred to as a production job N) of the boards of the board type to be produced first, production of boards in which component types A, B, F, G, and H are used is performed in the production (hereinafter, referred to as a production job N+1) of the boards of the board type to be produced secondarily, and production of boards in which component types A, D, F, and I are used is performed in the production (hereinafter, referred to as a production job N+2) of the boards of the board type to be produced thirdly, is illustrated.

Figure 8:
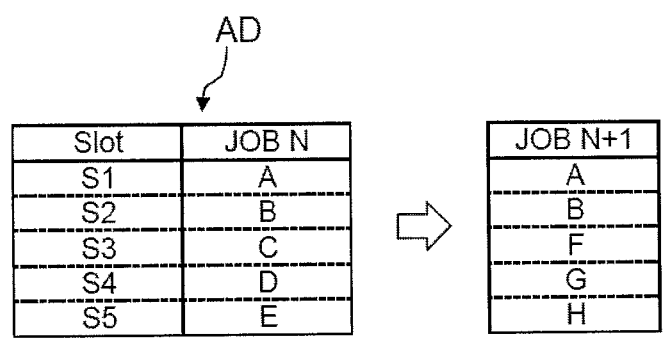
FIG. 8 is a view illustrating component arrangement data stored in the RAM of the control device.

FIG. 8 illustrates component arrangement data AD, and thus, in FIG. 8, an example in which the feeder 21 having the component type A loaded thereon is mounted at a first slot position S1 of the slot 23 of the component supply device 11, the feeder 21 having the component type B loaded thereon is mounted at a second slot position S2, and similarly, the feeder 21 having the component type C loaded thereon is mounted at a third slot position S3, the feeder 21 having the component type D loaded thereon is mounted at a fourth slot position S4, and the feeder 21 having the component type E loaded thereon is mounted at a fifth slot position S5, in the production job N, is illustrated.

Figure 9:
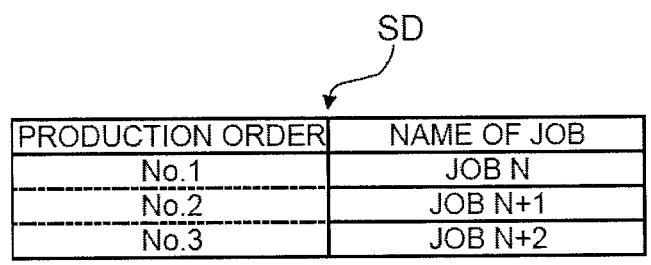
FIG. 9 is a view illustrating a production schedule stored in the RAM of the control device.

FIG. 9 illustrates production plan data SD, and thus, in FIG. 9, an example in which, first, the production job N is executed, then, the production job N+1 is executed, and lastly, the production job N+2 is executed, is illustrated.

Figure 10:
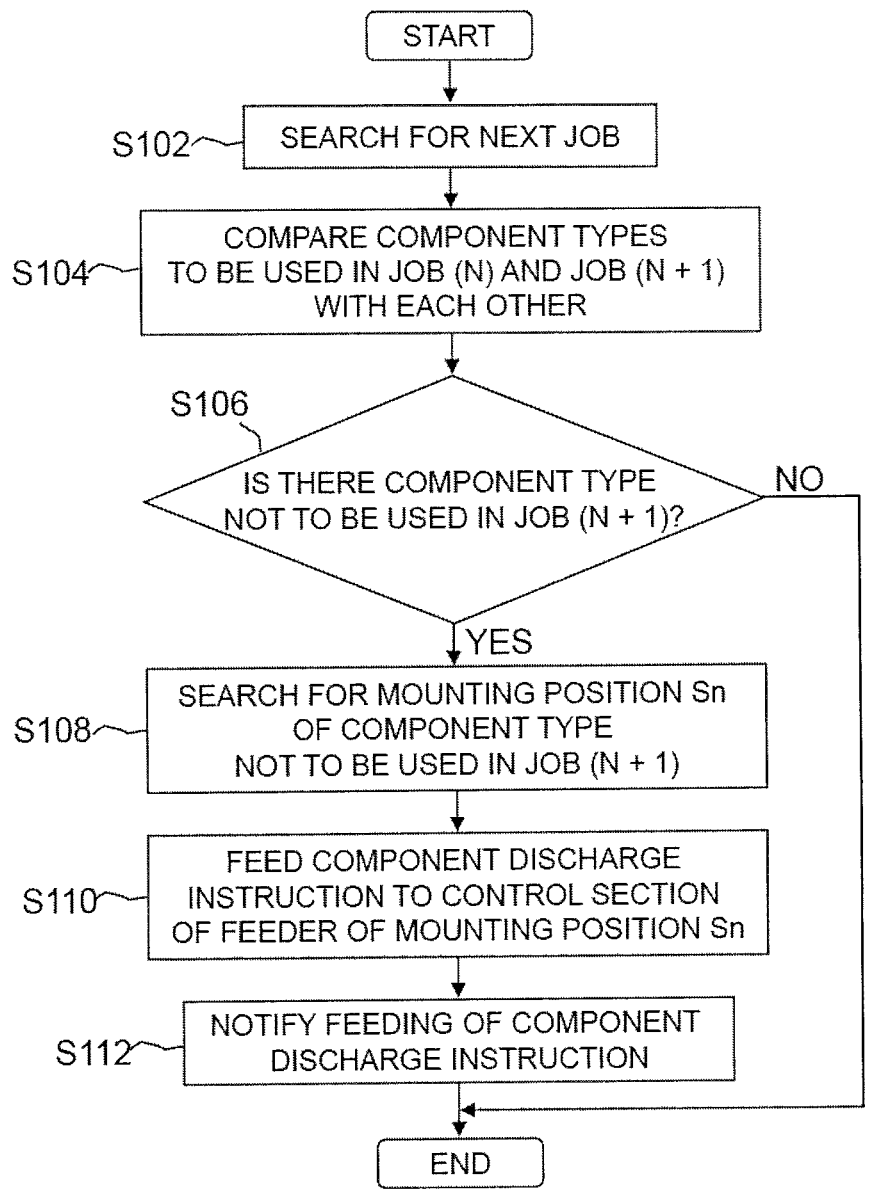
FIG. 10 is a view illustrating a flowchart for discharging an unnecessary component type for the board type to be produced next.

FIG. 10 illustrates a flowchart which is executed by the CPU 201 for automatically discharging a component type unnecessary in the board types to be produced next when the setup is changed when the board types to be produced is changed. Hereinafter, procedure in which the initial production job N is finished, and setup changing is performed in the next production job N+1 based on the production plan data SD, will be described.

In addition, when the production job N is executed, as can be apparent from FIG. 8, the feeder 21 having the component type A loaded thereon is mounted at the first slot position S1 of the slot 23 of the component supply device 11, the feeder 21 having the component type B loaded thereon is mounted at the second slot position S2, and similarly, the feeder 21 having the component type C loaded thereon is mounted at the third slot position S3, the feeder 21 having the component type D loaded thereon is mounted at the fourth slot position S4, and the feeder 21 having the component type E loaded thereon is mounted at the fifth slot position S5.

In this state, when the initial production job N is finished and a setup instruction is issued, the control device 15 refers to the production plan data SD illustrated in FIG. 9 stored in the RAM 203, and searches for the production job N+1 to be executed next in step S102. Next, in step S104, the control device 15 compares the component types to be respectively used in the production job N and the next production job N+1 with each other based on the component data PD (refer to FIG. 7) stored in the RAM 203. Next, in step S106, the control device 15 determines whether or not there is a component type not to be used in the next production job N+1 among the component types used in the production job N.

In a case where the determination result in step S106 is YES, that is, in a case where the control device 15 determines that there is a component type not to be used in the next production job N+1, the process moves to step S108, and in a case where the determination result in step S106 is NO, the program is finished.

In step S108, the control device 15 searches for amounting position of the component type not to be used, that is, a slot position Sn (n=1 to 5) of the feeder 21 having the component type not to be used which is loaded thereon, based on the component arrangement data AD (refer to FIG. 8) stored in the RAM 203. Next, in step S110, the control device 15 instructs the discharge of the components to the feeder 21 of the slot position Sn at which the component type not to be used in the next production job N+1 is loaded.

For example, as illustrated in FIG. 7, when the component types to be used in the production job N are A to E and the component types to be used in the next production job N+1 are A, B, and F to H, the component types not to be used in the next production job N+1 are C to E, and the slot positions at which the component types C to E are loaded are S3 to S5 according to the component arrangement data AD illustrated in FIG. 8.

Therefore, the control device 15 sends the discharge instruction of the components to the control section 39 of each of the feeders 21 mounted at the slot positions S3 to S5. Based on the component discharge instruction, the first and second servomotors 25 and 26 which configure the tape driving device are respectively driven to be reversely rotated by the control section 39 of each of the feeders 21 mounted at the slot positions S3 to S5. Accordingly, the carrier tapes 100 loaded on each of the feeders 21 retreats toward the tape insertion port 21d. In addition, when the end section of the carrier tape 100 retreats to the predetermined position which passes through the dog 86, the dog 86 is swung, the tape detection sensor 85 turns OFF, and thus, the first and second servomotors 25 and 26 are stopped by a signal change of the tape detection sensor 85.

Next, in step S112, the control device 15 displays that the component discharge instruction is sent to each of the feeders 21 mounted at the slot positions S3 to S5 in the display device 207a of the operation panel 207, and notifies this to the operator. Based on the notification, the operator pulls out the carrier tape 100 discharged to the tape insertion port 21d, and detaches the reel 24a (24b) wound around the carrier tape 100 from the feeder 21.

The above-described step S106 configures a component determination section which determines a component type not to be used in the production of the next board when the production of the board produced by the component mounting apparatus 10 is switched. In addition, the above-described step S110 configures a discharge instruction section which sends the instruction of discharging the carrier tape 100 which accommodates a component type determined not to be used in the production of the next board type by the component determination section (step S106) therein, to the tape insertion port 21d.

In this manner, by automatically discharging the carrier tape 100 which accommodates a component type not to be used in the production of the next board type therein, labor and time are not required for discharging the carrier tape 100 from the feeder 21, and the setup changing work becomes easy. Besides, it is also possible to suppress occurrence of a human error of discharging a carrier tape 100 from a wrong feeder 21.

Moreover, in a state where the feeder 21 remains fixed to the feeder mounting section 22 of the component supply device 11, only the components (carrier tape 100) may be exchanged, and thus, it is possible to substantially shorten the time for setup changing.

In addition, when the feeder 21 having the above-described configuration is used, it is possible to insert the carrier tape 100 which accommodates a component type to be used in the production of the next board type therein into the empty feeder 21 through which the carrier tape 100 has just been discharged, and thus, it is also possible to reduce the number of feeders 21.

In other words, the component type to be used newly in the production job N+1 is searched based on the component data PD in FIG. 7 and the production plan data SD in FIG. 9, and the component types are displayed in the display device 207a of the operation panel 207 of the control device 15. The operator prepares the reels 24a (24b) around which the carrier tapes 100 which accommodate the component types F to H to be used newly in the production job N+1 therein are wound, and mounts the reels 24a (24b) on the feeders 21, based on the display contents of the display device 207a. After this, when the operator opens the tape insertion port 21d by operating the tape insertion recognition lever 51 and inserts the carrier tape 100 into the tape insertion port 21d, the first and second servomotors 25 and 26 which configure the tape driving device are driven to be forwardly rotated. Accordingly, the carrier tape 100 advances, and the components accommodated in the carrier tape 100 are automatically conveyed to the suction position 21a at which the components are suctioned by the suction nozzle which is not illustrated.

In this case, before mounting the reel 24a (24b) onto the feeder 21, by reading the bar code BC given to the reel 24a (24b) by a reading device which is not illustrated, and by ascertaining the information of the component type, association between the slot position Sn at which the feeder 21 is mounted and the information of the component type is performed. In other words, the component arrangement data AD stored in the RAM 203 is rewritten to the contents that the component types F to H are loaded on each of the feeders 21 at the slot positions S3 to S5 at which the component types C to E are mounted (refer to the arrow in FIG. 8).

In the above-described embodiment, when the production of the board type is switched, the carrier tape 100 which accommodates a component type not to be used in the production of the next board therein is automatically discharged to the tape insertion port 21d, but by continuously monitoring a use plan of component types accommodated in the carrier tapes 100 by the control device 15, when it is determined that there is no use plan (when it is determined that the component type will not be used in the production of the next board type), even in the middle of the production of the board, it is possible to send the component discharge instruction of discharging the carrier tape 100 which accommodates the component types planned not to be used therein to the tape insertion port 21d. Accordingly, before the production of the board type is switched, it is possible to send the instruction of discharging the carrier tape 100 which accommodates a component type not to be used in the production of the next board type therein to the tape insertion port 21d.

According to the above-described embodiment, the control device 15 of the component mounting apparatus 10 includes a component type determination section S106 which determines a component type not to be used in the production of the next board type when the production of the board to be produced by the component mounting apparatus 10 is switched, and a discharge instruction section S110 which sends the instruction of discharging the carrier tape 100 which accommodates the component type determined not to be used in the production of the next board type therein by the component determination section S106 to the tape insertion port 21d.

Accordingly, since it is possible to automatically discharge the carrier tape 100 which accommodates a component type not to be used in the production of the next board type therein to the tape insertion port 21d, labor and time are not required for discharging the carrier tape 100 from the feeder 21, and it is possible to suppress occurrence of a human error, such as discharge of a carrier tape 100 from a wrong feeder 21.

In addition, while the feeder 21 remains fixed to the feeder mounting section 22, only the components (carrier tape 100) may be discharged from the feeder 21, and thus, the setup changing work becomes easy. Moreover, since the carrier tape 100 which accommodates a component type to be used in the production of the next board type therein can be inserted into the feeder 21 through which the carrier tape 100 has just been discharged, it is also possible to reduce the number of feeders 21.

According to the above-described embodiment, since the control device 15 of the component mounting apparatus 10 includes the display device 207a which notifies the component discharge instruction after the component discharge instruction is issued, the operator can easily ascertain from which feeder 21 the carrier tape 100 is discharged based on the contents displayed in the display device 207a.

According to the above-described embodiment, since a method for determining a component type not to be used in the production of the next board type and discharging the carrier tape 100 which accommodates the component type therein to the tape insertion port 21d when the production of the board type to be produced by the component mounting apparatus 10 is switched is employed, it is possible to automatically discharge the carrier tape 100 which accommodates a component type not to be used in the production of the next board type therein to the tape insertion port 21d. Accordingly, labor and time are not required for discharging the carrier tape 100 from the feeder 21, and it is possible to suppress occurrence of a human error, such as discharge of a carrier tape 100 from a wrong feeder 21.

According to the above-described embodiment, each of the feeders 21 of the component supply device 11 includes the control section 39 which controls the tape driving device (first and second servomotors 25 and 26) which drives the carrier tape 100, the component mounting apparatus 10 includes the control device 15 which instructs the discharge or the supply of the component Pa with respect to each of the control sections 39, the control device 15 determines a component type not to be used in the production of the next board type with respect to the control section 39 when the production of the board type is switched, and sends the instruction of discharging the carrier tape 100 which accommodates the component type therein to the tape insertion port 21d.

Accordingly, since the instruction of discharging the carrier tape 100 which accommodates the component types not to be used in the production of the next board type therein to the tape insertion port 21d, is sent to each of the control sections 39 of the feeders 21 by the control device 15 when the production of the board type is switched, it is possible to automatically discharge the carrier tape 100 which accommodates a component type not to be used in the production of the next board type therein to the tape insertion port 21d. Accordingly, the component mounting apparatus 10 in which labor and time are not required for discharging the carrier tape 100 from the feeder 21, and it is possible to suppress occurrence of a human error, such as discharge of a carrier tape 100 from a wrong feeder 21, can be obtained.

According to the above-described embodiment, when the control device 15 constantly monitors the use plan of component types accommodated in the carrier tapes 100 and determines that there is no use plan, the control device 15 sends the component discharge instruction of discharging the carrier tape 100 which accommodates the component types therein to the tape insertion port 21d. Accordingly, before the production of the board is switched, it is possible to send the instruction of discharging the carrier tape 100 which accommodates the component types not to be used in the production of the next board type therein to the tape insertion port 21d.

In the above-described embodiment, the feeder 21 into which the two carrier tapes 100 can be inserted and discharged is described, but the disclosure can also be employed in the feeder 21 into which only one carrier tape 100 can be automatically inserted and discharged, and in this case, the configuration of the stopper member 31 which makes the following carrier tape 100 on standby or the downstream side pressing member 33 can be unnecessary.

In addition, in the above-described embodiment, the feeder 21 including the sprockets 61 and 62, and 63 and 64 two by two on each of the front side and rear side, is described, but the feeder 21 described in the embodiment is merely one appropriate example of the disclosure. In other words, at least, the feeder 21 which can automatically convey the carrier tape 100 inserted into the tape insertion port 21*d* to the suction position 21*a* at which a component is suctioned, and can automatically discharge the carrier tape 100 to the tape insertion port 21*d*, may be employed.

Furthermore, in the above-described embodiment, an example in which the display section which notifies the component discharge instruction is configured with the display device 207*a* of the operation panel 207, is described, but the display section can be configured with lamps provided corresponding to each of the slots 23. In other words, information to which feeder 21 the component discharge instruction is sent may be notified to the operator by turning on the lamp.

In addition, the setup changing in the above-described embodiment can also be employed in a case of producing one or a predetermined number of boards.

In this manner, the disclosure is not limited to the configuration described in the above-described embodiment, and various aspects can be employed within the range that does not depart from the main idea of the disclosure described in the range of the claims.

INDUSTRIAL APPLICABILITY

The feeder control device and control method and the component mounting apparatus according to the disclosure are appropriate for a device which uses a feeder having a configuration in which the carrier tape inserted into the tape insertion port can be automatically conveyed to the suction position at which a component is suctioned, and can be automatically discharged to the tape insertion port.

REFERENCE SIGNS LIST

10 . . . component mounting apparatus, 11 . . . component supply device, 15 . . . control device, 21 . . . feeder, 21*a* . . . suction position, 21*d* . . . tape insertion port, 22 . . . feeder mounting section, 23 . . . mounting position (slot), 25, 26 . . . tape driving device (servomotor), 39 . . . control section, 61 to 64 . . . sprocket, 83 . . . recognition sensor, 100 . . . carrier tape, 207*a* . . . display section (display device), S106 . . . component determination section, S110 . . . discharge instruction section

The invention claimed is:

1. A component mounting apparatus, comprising:
a component supply device including feeder and a reel detachably attached to the feeder, the reel configured to hold a carrier tape, the feeder configured to convey in a feeding direction the carrier tape that accommodates a component to be mounted on a first board which is a first board type of multiple board types, the feeder including a feeder main body, a sprocket configured to engage with the carrier tape, a tape driving device to rotate the sprocket to drive the carrier tape engaged with the sprocket, a tape insertion port at a rear end of the feeder main body where the carrier tape from the reel enters the feeder, and a control section configured to control the driving device; and
a control device configured to
store component data including information of component types mounted in production of each of the multiple board types and information indicating a relationship between the component types and the feeder,
determine that a second board is to be produced, the second board is a second board type of the multiple board types that different from the first board type,
determine differences between the component types mounted on the first board type and those mounted on the second board type,
determine whether the component accommodated by the carrier tape is to be mounted on the second board, and
instruct the control section to discharge the carrier tape when determined that the component accommodated by the carrier tape is not to be mounted on the second board based on the component data,
wherein when the control section is instructed to discharge the carrier tape, the control section controls the tape driving device to convey the carrier tape in a direction reverse to the feeding direction to make an end of the carrier tape reversely pass through the sprocket from a suction position at which the component is suctioned by a mounter to the tape insertion port.

2. The component mounting apparatus according to claim 1, wherein
the sprocket is upstream of the tape insertion port in the feeding direction of the carrier tape.

3. The component mounting apparatus according to claim 1, wherein
the sprocket is a first sprocket in the feeding direction of the carrier tape of a plurality of sprockets included with the feeder.

4. The component mounting apparatus according to claim 3, wherein
the plurality of sprockets includes a second sprocket and the suction position at which the component is suctioned is downstream of the second sprocket.

5. The component mounting apparatus according to claim 1, wherein
the feeder includes a tape conveyance rail on which the carrier tape is conveyed from the insertion port at an upstream end of the tape conveyance rail to the suction position at a downstream end of the tape conveyance rail.

6. The component mounting apparatus according to claim 5, wherein
the feeder includes a tape detection sensor that detects a presence of the carrier tape on the tape conveyance rail, the tape detection sensor include a dog configured to abut against an upper face of the tape conveyance rail.

7. The component mounting apparatus according to claim 6, wherein
when the carrier tape is inserted into the tape conveyance rail the dog is pushed up by the carrier tape and the tape detection sensor detects the carrier tape.

8. The component mounting apparatus according to claim 6, wherein
when the end of the carrier tape reversely passes through the sprocket, the tape detection sensor determines that the carrier tape does not exist on the tape conveyance rail.

* * * * *